United States Patent
Holm et al.

[11] Patent Number: 5,940,683
[45] Date of Patent: Aug. 17, 1999

[54] LED DISPLAY PACKAGING WITH SUBSTRATE REMOVAL AND METHOD OF FABRICATION

[75] Inventors: Paige M. Holm, Phoenix; Chan-Long Shieh, Paradise Valley; Curtis D. Moyer, Phoenix, all of Ariz.

[73] Assignee: Motorola, Inc., Schaumburg, Ill.

[21] Appl. No.: 08/588,470

[22] Filed: Jan. 18, 1996

[51] Int. Cl.⁶ .................................................. H01L 21/00
[52] U.S. Cl. ............................... 438/23; 438/22; 438/26
[58] Field of Search .................................. 345/39, 41, 44, 345/46, 82; 438/26, 23

[56] References Cited

U.S. PATENT DOCUMENTS

| | | | |
|---|---|---|---|
| 5,272,117 | 12/1993 | Roth et al. | 438/14 |
| 5,482,896 | 1/1996 | Tang | 438/118 |
| 5,612,231 | 3/1997 | Holm et al. | 438/23 |
| 5,621,225 | 4/1997 | Shieh et al. | |
| 5,721,160 | 2/1998 | Forrest et al. | 438/126 |
| 5,780,321 | 7/1998 | Shieh et al. | |

*Primary Examiner*—Kevin M. Picardat
*Assistant Examiner*—Deven Collins
*Attorney, Agent, or Firm*—Eugene A. Parsons; William E. Koch; Rennie W. Dover

[57] ABSTRACT

A light emitting diode display package and method of fabricating a light emitting diode (LED) display package including a LED array display chip, fabricated of an array of LEDs, formed on a substrate, having connection pads positioned about the perimeter of the LED array display chip, a separate silicon driver chip having connection pads routed to an uppermost surface, positioned to cooperatively engage those of the display chip when properly registered and interconnected using wafer level processing technology. The display chip being flip chip mounted to the driver chip and having a layer of interchip bonding dielectric positioned between the space defined by the display chip and the driver chip. The LED display and driver chip package subsequently having selectively removed the substrate onto which the LED array was initially formed, thereby exposing the connection pads of the display chip and a remaining indium-gallium-aluminum-phosphide (InGaAlP) epilayer. The light emitted from the LED display chip, being emitted through the remaining indium-gallium-aluminum-phosphide (InGaAlP) epilayer of the display chip.

23 Claims, 3 Drawing Sheets

LED DISPLAY PACKAGING WITH SUBSTRATE REMOVAL AND METHOD OF FABRICATION

FIELD OF THE INVENTION

The present invention pertains to light emitting diode arrays and more specifically to new and novel packaging and methods of packaging light emitting diode arrays together with drive electronics.

BACKGROUND OF THE INVENTION

Light emitting diodes (LEDs) are useful in various displays and especially in a new compact virtual display that utilizes a two-dimensional array of LEDs as an image source. Generally, these two dimensional arrays include large numbers of light emitting devices, from 5000 to 80,000 or more. A specific example exists where the image source consists of a high pixel count 2-dimensional array of LEDs, such as 240 columns by 144 rows, for a total of 34,560 pixels. An array the size of this specific example requires a total of 384 external interconnections to properly scan, or activate, and produce an image thereon. The array of LEDs is used to form complete images containing pictorial (graphic) and/or alphanumeric characters. The complete images are then magnified to produce virtual images which appear to an operator to be at least the size of a standard sheet of paper.

A major problem facing the productizing of such arrays is the penalty paid for this very large number of connection, or bond, pads required to provide information to the array. The foremost drawback is the increased semiconductor chip or chip area required for the connection pads and the interconnect fanout necessary to connect the connection pads to the rows and columns. A significant portion of the projected cost of the semiconductor chip on which the array is constructed is in the starting material and, with the 240×144 example set up for wire bonded external interconnects, the emitting region (light emitting diode array) occupies less than 20% of the total chip area with the remaining 80% required for connection pads and interconnect fan out. Conventional direct chip attach (DCA) bonding will improve this ratio only slightly because of the large pad sizes and interconnect pitches associated with the current state-of-the-art.

A large bonding substrate area is also required since a similar pad and interconnect fanout pattern must be repeated on accompanying semiconductor chips containing the drive electronics. Furthermore, the drive chips themselves must be large enough to accommodate the large number of connection pads (384 in this example). The net result is a large overall module which is not attractive for the applications of portable electronic devices where a premium is placed on small physical volumes.

One way to alleviate package size problems in LED display packaging is to simplify the package and assembly by integrating the LED display directly with the driver board, thereby minimizing the size requirement for both the display chip and the driver chip. Traditionally, there is provided a plurality of driver and controller circuits mounted on a substrate, or in the alternative, mounted on an optically transparent substrate, having data input terminals and further having control signal output terminals interfaced with the leads of the light emitting devices for activating the light emitting devices to generate images in accordance with data signals applied to the data input terminals.

In inorganic LED configurations, generally a semiconductor substrate, or integrated circuit, is mounted on a printed circuit board or the like and the accepted method for connecting the substrate to external circuits is to use standard wire bond technology. However, when a semiconductor substrate having a relatively large array of electrical components or devices formed thereon is to be connected, standard wire bond techniques can become very difficult. For example, if a relatively large array (greater than, for example, 10,000 or 100×100) of light emitting diodes is formed on a substrate with a pitch (center-to-center separation) of P, then connection pads on the perimeter of the substrate will have a 2P pitch. This is true because every other row and every other column goes to an opposite edge of the perimeter to increase the distance between connection pads as much as possible.

At the present time wire bond interconnects from connection pads having a pitch of 4.8 mils is the best that is feasible. Thus, in the array mentioned above of 100×100 light emitting diodes the connection pads on the perimeter of the semiconductor chip would have a minimum pitch of 4.8 mils, with 50 connection pads situated along each edge of the perimeter. As more devices are included in the array, more connection pads are required and the perimeter size to accommodate the additional connection pads increases at an even greater rate. That is, since the minimum pitch of the bonding pads is 4.8 mils, the pitch of the devices in the array can be as large as 2.4 mils, or approximately 61 microns, without effecting the size of the substrate. Thus, even if the devices can be fabricated smaller than 61 microns, the minimum pitch of the bonding pads will not allow the perimeter of the substrate to be made any smaller. It can quickly be seen that the size of the substrate is severely limited by the limitations of the wire bonding technology.

Thus, there is a need for interconnect and packaging structures and techniques which can substantially reduce the limitations on size of LED display devices and semiconductor chips and which can reduce the amount of required surface area.

Accordingly, it is highly desirable to provide methods of fabricating LED arrays and interconnect apparatus packages which overcome these problems.

It is a purpose of the present invention to provide a new and improved method of fabricating LED arrays and interconnect apparatus packages.

It is a further purpose of the present invention to provide a new and improved LED array and integrated driver circuitry packaging for driving large arrays of LEDs.

It is another purpose of the present invention to provide new and improved integrated circuitry which requires less semiconductor chip area for larger arrays of devices.

It is another purpose of the present invention to provide a new and improved LED array and driver package with a substantially improved fill factor.

It is a still further purpose of the present invention to provide a new and improved method of fabricating LED arrays and driver packaging which is simpler and more efficient than prior methods and which is easily adaptable to high production levels.

SUMMARY OF THE INVENTION

The above problems and others are substantially solved and the above purposes and others are realized in a method of fabricating a light emitting diode array and driver package, utilizing substrate removal. Disclosed in the present invention is a LED display package comprised of an integrated circuit, including an addressable array of light emitting diodes (LEDs) formed on a substrate, with all of the LEDs being connected in rows and columns. The array of LEDs, which comprises the display chip of the present invention, further having connection pads formed about the perimeter of a display area defined in the display chip. There is provided as a separate component, a silicon (Si) driver wafer, onto which known good display chips are aligned and attached directly to known good driver chip sites.

The individual display chips of the present invention are designed to have a plurality of connection or bond pads routed to an area about the perimeter of the display area of the display chip. The silicon (Si) driver chip is designed to have connection or bond pads formed in an upper major surface so as to cooperatively match the connection pads of the display chip once exposed and the display chip is properly registered thereon. Interchip connections of the connection pads are made through wafer level metallization. In addition, there is provided a plurality of bond pads routed to the perimeter of the Si driver chip which serve as separate external data input terminals.

In forming the device of the present invention, the goal of maximizing product yield is achieved by attaching only known good display chips to known good driver chip sites. To achieve this goal, during the fabrication process, the LED arrays are wafer probed to screen out any bad arrays. Additionally, the array driver circuitry is fabricated on a silicon wafer, and tested to screen out any bad chips. Once testing is complete, the display chip is flip chip mounted onto the known good driver chip sites contained on the whole silicon wafer. A layer of interchip bonding dielectric adhesive is positioned between the display chips and the driver chips.

Next, the gallium arsenide (GaAs) substrate onto which the display chip was initially formed is selectively removed by etching the whole assembly or selectively etching a release layer formed in the LED structure, leaving the connection pads of the display chip and an indium-gallium-aluminum-phosphide (InGaAlP) epilayer exposed. Light is emitted from the display chip, in a direction opposite the mounting of the Si driver chip. The emission of light in this direction occurs without the interference of the typical metal line interconnections, thereby improving the display performance by allowing higher luminance and larger pixel fill factors. In addition, there exists the potential for higher yield, lower cost packaging by eliminating the standard wire bond interconnects and size requirements presently known in the art.

As a final step in the fabrication of the LED array and driver package of the present invention, vias are etched into the bonding dielectric layer and patterned metal interconnect lines are made between the connection pads of the display chip and the connection pads of the driver chip using wafer level manufacturing technology.

Packaging the array together with its drive electronics, by interfacing the required large number of connection pads on the array to the same number of connection pads of the associated electronic circuitry, as disclosed in the present invention, produces a manufacturing process that is reliable and repeatable while maintaining small display and driver chips, overall compact package size, and cost effectiveness.

BRIEF DESCRIPTION OF THE DRAWINGS

The novel features believed characteristic of the invention are set forth in the claims. The invention itself, however, as well as other features and advantages thereof will be best understood by reference to detailed descriptions which follow, when read in conjunction with the accompanying drawings, wherein:

DESCRIPTION OF THE PREFERRED EMBODIMENT

During the course of this description, like numbers are used to identify like elements and steps in the fabrication of the LED array and driver substrate package according to the different figures that illustrate the present invention.

Figure 1:
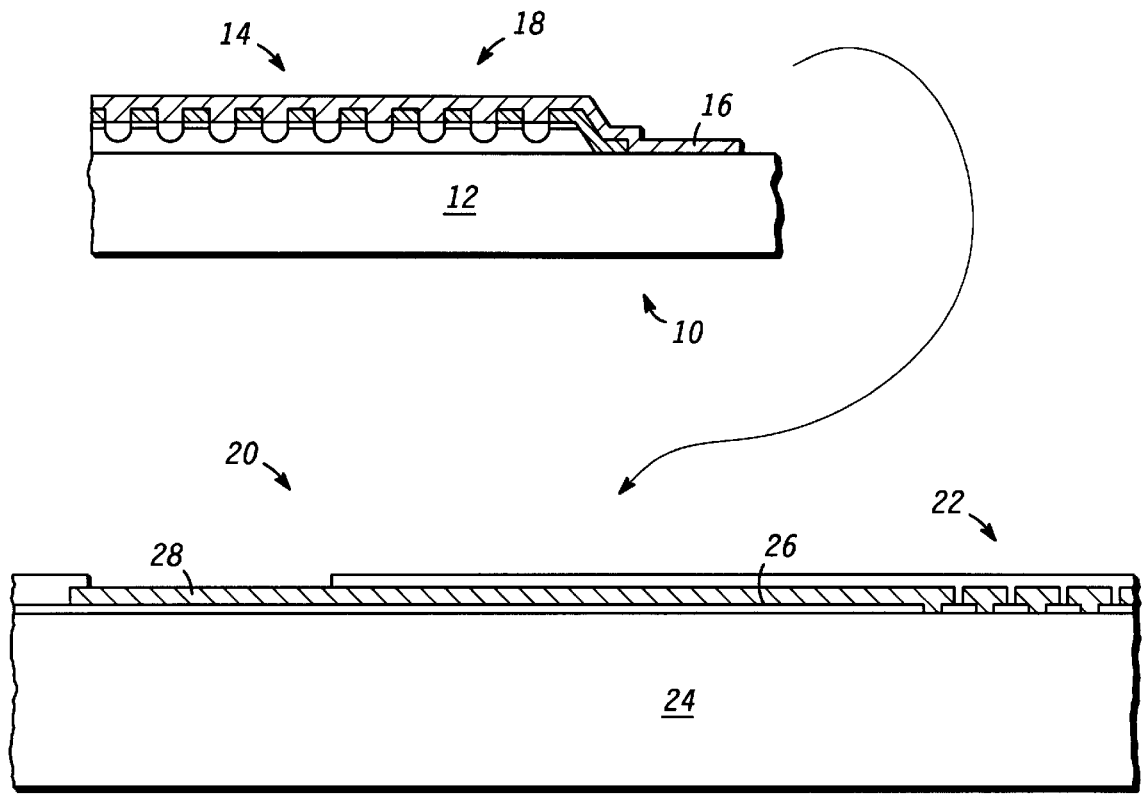
FIG. 1 is a simplified cross-sectional view illustrating a light emitting diode display chip and driver chip in accordance with the present invention.

Referring specifically to FIG. 1, a first structure in the fabrication process of a light emitting diode display package, comprised of a light emitting diode array display chip 10, made up on an array of light emitting diodes, and having a cooperating driver chip 20, is illustrated in simplified sectional views. Light emitting diode (LED) array display chip 10 and driver chip 20 are shown in FIG. 1 as separate components, prior to flip chip attachment. Illustrated is LED array display chip 10 which structurally includes a substrate 12 having a LED display array 14 formed thereon using any of the currently known methods for forming indium-gallium-aluminum-phosphide (InGaAlP) LED display arrays.

Referring more specifically to FIG. 1, LED array display chip 10, formed according to any of the conventional methods for forming InGaAlP LED arrays known in the art, as well as those disclosed herein, is shown having display connection pad 16 formed and routed about the perimeter of a display area 18 of LED array display chip 10. The pads 16 are formed about the perimeter of display area 18 of LED display array 14, positioned in row and column formation.

In this specific example, display array 14 has a display with a 240×144 pixel resolution. Thus, the size of actual display area 18 is approximately 4.8 mm×2.88 mm. The number of connection pads 16 required for display array 14 is 384 (240+144=384). According to the present invention, connection pads 16 are formed about the perimeter of display chip 10 as previously described.

As illustrated, a silicon (Si) driver chip 20, initially formed on a whole silicon driver wafer (illustrated in FIG. 2), contains all necessary array drivers, control electronics and memory needed to form a fully functional display module when the Si wafer is diced, schematically referred to in this disclosure as drive electronics 22. Driver chip 20 is fabricated on a substrate 24 and has formed on an uppermost surface 26 of chip 20, a plurality of cooperating driver connection pads 28 to those pads 16 of LED array device 10. By positioning connection pads 16 and 28 in an essentially planar cooperative formation, directly adjacent and about the perimeter of display area 18 and on uppermost surface 26 of driver chip 20 respectively, the typical space required for the fan out of the conventional leads and in this instance, the actual connections is decreased, thereby making the fabrication of the device more economical. There may be provided in addition to connection pads 28 of driver chip 20, a plurality of external interconnection pads (not shown) serving as data input terminals.

Figure 2:
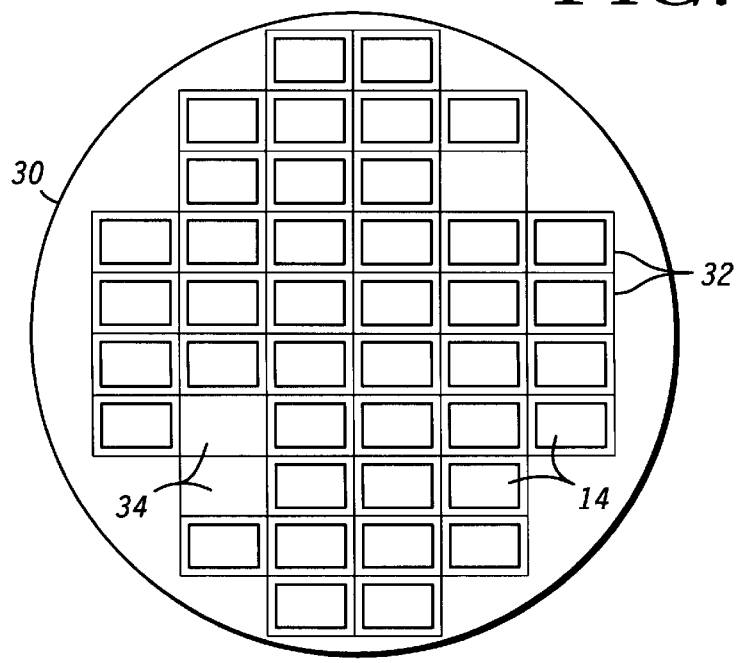
FIG. 2 is a simplified and enlarged top view of a whole silicon wafer of the present invention, having LED display chips attached to driver chip sites.

During this initial step in the formation of the LED display and driver package of the present invention, additional steps can be taken to ensure the efficiency of the final package. Referring to FIG. 2, shown in top view is a whole silicon wafer 30 of the present invention. It is disclosed to fabricate the plurality of LED arrays 14 on a display wafer, using wafer probe techniques to screen out bad arrays. In addition, the array driver circuitry is fabricated on silicon wafer 30 and can be tested to screen out any bad chips, prior to the flip chip mounting of LED array display chips 10 to Si driver chips 20. Illustrated in FIG. 2 is a top view of whole silicon wafer 30 having formed thereon a plurality of Si driver chips, or driver sites, shown as functional driver chips 32 and non-functional driver chips 34. During the fabrication of the LED display and driver package disclosed herein, the prescreened LED arrays 14 are bonded to the fully functional driver chips 32. No LED arrays 14 are bonded to the non-functional driver chips 34. Illustrated is the resulting Si wafer 30. This step of prescreening enables product yield to be maximized by rejecting non-functional LED arrays 14 and non-functional driver chips 34 during the initial steps of the fabrication process. Once the interconnect metallization patterning and etching away of substrate 12 are complete, the Si wafer 30 can be diced into display modules producing a plurality of individual single chip displays for virtual imaging.

Figure 3:
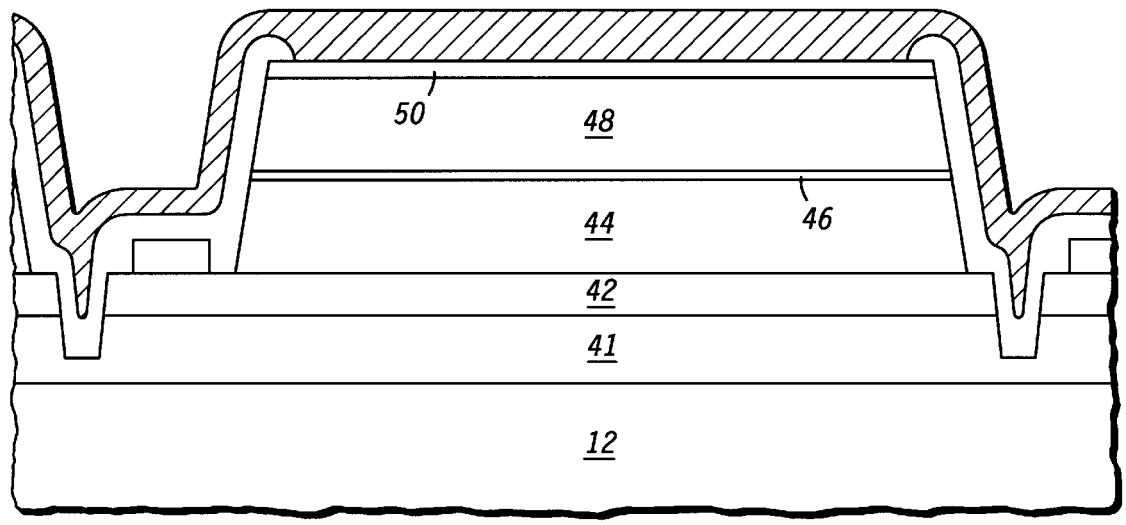
FIG. 3 is a simplified cross-sectional view illustrating a multi-layer embodiment of a light emitting diode chip of the present invention.

In a first specific example, and as illustrated in FIG. 3, one such method for forming an InGaAlP LED structure 40 of the present invention includes substrate 12 having an upper surface on which is positioned, in the following order, an etch stop layer 41, a conductive layer 42, a first carrier confinement layer 44, an active layer 46, a second carrier confinement layer 48 and a conductive cap layer 50. It is understood that etch stop layer 41, conductive layer 42, and first carrier confinement layer 44 must be substantially transparent to allow for the passage of the light emitted from active layer 46 back through these layers once substrate 12 has been selectively removed. In this specific fabrication of LED display array 14, substrate 12 is formed of gallium arsenide (GaAs) so that substrate 12 is a semiconductor. Etch stop layer 41 is formed of a transparent non-conductive layer, and facilitates the removal of substrate 12. In the alternative, etch stop layer 41 could be a release layer (not shown), formed of a material such as aluminum arsenide (AlAs), allowing for the release layer to be selectively etched away, thereby separating substrate 12 from the remaining LED epilayer structure. Conductive layer 42 is a substantially transparent layer of either GaAs or InGaAlP epitaxially grown on the surface of etch top layer 41 and is heavily doped ($10^{18}$ or greater) with a dopant such as selenium, silicon, etc. to make it a relatively good N+-type conductor. In this specific method of fabricating LED display array 14, conductive layer 42 is grown to a thickness of less than 500 angstroms so that it remains substantially transparent. First carrier confinement layer 44 is a transparent layer of indium-gallium-aluminum-phosphide (InGaAlP) epitaxially grown on the surface of conductive layer 42 and doped ($10^{17}$–$10^{18}$) with silicon for N-type semiconductivity. Carrier confinement layer 44 is grown to a thickness in the range of approximately 1000–8000 angstroms, yet remaining transparent to allow for the passage of the emitted light from active layer 46. Active layer 46 is an undoped layer of indium-gallium-aluminum-phosphide (InGaAlP) epitaxially grown on the surface of carrier confinement layer 44 to a thickness in the range of approximately 100–1000 angstroms. Second carrier confinement layer 48 is a layer of indium-gallium-aluminum-phosphide (InGaAlP) epitaxially grown on the surface of active layer 46 and doped ($10^{16}$–$10^{18}$) with zinc for P-type semiconductivity. In this specific embodiment, carrier confinement layer 48 is grown to a thickness in the range of approximately 1000–8000 angstroms. Conductive cap layer 50 is epitaxially grown on the surface of carrier confinement layer 48 to a thickness in the range of approximately 200–1000 angstroms and is heavily doped ($10^{19}$) with zinc to make it a good P+-type conductor. The molecular fraction of aluminum, x, in $(Al_xGa_{1-x})_{0.5}In_{0.5}P$ of carrier confinement layers 44 and 48 is in the range of approximately 0.7 to 1.0 and in active layer 46 is approximately 0.0 to 0.24. The Al composition in active layer 46 and conductive layer 42, determines the wavelength and the light emitted therethrough, accordingly, the Al composition of layer 42 must be larger than layer 46. For simplicity of fabrication in the specific example disclosed, the layers are epitaxially grown as blanket layers over the entire substrate 12, but it will be understood that other methods, including masking and selective growth or selective etching, can be utilized to provide a plurality of areas necessary for the formation and definition of individual pixels.

It will of course be understood that the various layers can be provided in many other forms and the present embodiment of an InGaAlP LED structure is disclosed because of the simplicity of formation. Also, in some embodiments additional layers may be provided for various special applications and it should be understood that the disclosed structure is intended as an example of the basic structure of LED display array 14 for purposes of this disclosure and not as a limitation.

In this method of fabrication of LED display array 14, a first structure (not shown) for LED array display chip 10 is disclosed in which cap layer 50 is selectively formed on carrier confinement layer 48 by any of several well known methods. For example, cap layer 50 is epitaxially grown as a blanket layer and a plurality of areas are removed by some convenient method such as etching to expose the surface of carrier confinement layer 48.

It will of course be understood that cap layer 50 could also be selectively grown or deposited by masking the surface of carrier confinement layer 48. In either method, cap layer 50 does not significantly alter the planarity of the process since it is only on the order of 500 angstroms thick. Additional information and further disclosure on this type of light emitting diode array and method of fabrication, as well as disclosed alternative embodiments, is available in U.S. Pat. No. 5,453,386, entitled "METHOD OF FABRICATION OF IMPLANTED LED", issued Sep. 26, 1995, assigned to the same assignee, and incorporated herein by this reference arid its divisional application, now copending application, Ser. No. 08/513,259, entitled "IMPLANTED LED ARRAY AND METHOD OF FABRICATION", filed Aug. 10, 1995, assigned to the same assignee and incorporated herein by this reference.

In another copending application entitled "ELECTRO-OPTIC INTEGRATED CIRCUIT AND METHOD OF FABRICATION", filed May 9, 1994, Ser. No. 08/239,626, assigned to the same assignee, and incorporated herein by this reference, and its divisional application, now copending application, Ser. No. 08/513,655, entitled "ELECTRO-OPTIC INTEGRATED CIRCUIT AND METHOD OF FABRICATION", filed Aug. 10, 1995, assigned to the same assignee and incorporated herein by this reference, disclosed is a method of fabricating InGaAlP LED array structures, as illustrated in FIG. 3, utilizing mesa etched processing technology. Specifically, disclosed is a structure in which portions of cap layer 50, first carrier confinement layer 44, active layer 46 and second carrier confinement layer 48 have been etched to form, or separate, mesas organized into a two dimensional array or matrix of rows and columns. The upper surface of each mesa in the array defines a light emitting area for a light emitting diode.

As stated, any additional methods now known for the fabrication of LED arrays in an InGaAlP LED structure, as well as those named above, can be utilized in the fabrication of the LED array display chip 10 of the present invention. Throughout this description references to rows and columns are made for simplicity of the disclosure but it will be understood by those skilled in the art, that these terms are completely interchangeable since rows and columns of a matrix or array generally depend upon a physical orientation.

Figure 4:
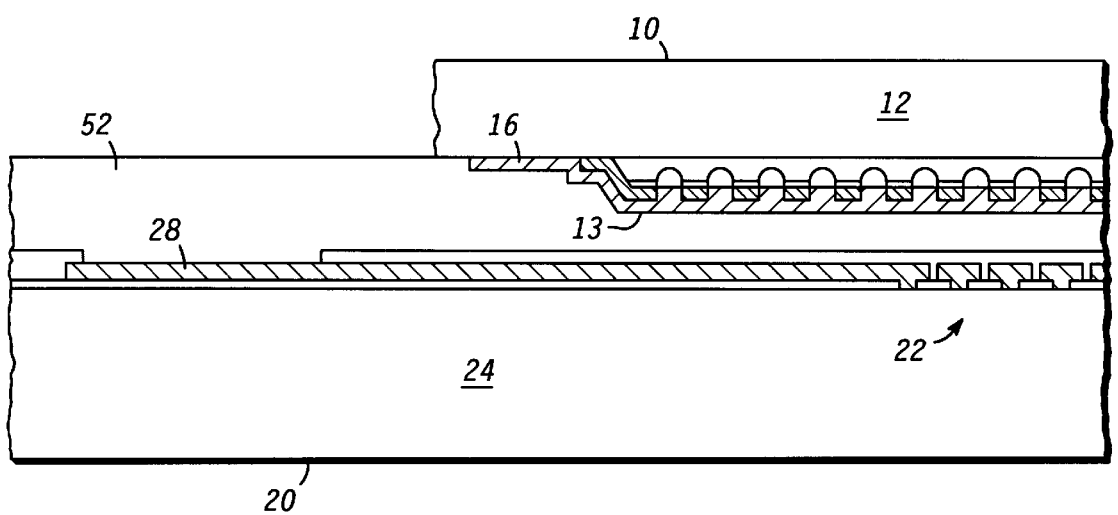
FIG. 4 is a simplified cross-sectional view illustrating a light emitting diode display chip of the present invention flip chip attached to the Si driver chip.

Referring to FIG. 4, illustrated is a second step in the fabrication of the LED array and driver package of the present invention. Specifically, shown is LED array display chip 10 flip chip mounted to silicon (Si) driver chip 20. A layer of interchip bonding dielectric adhesive 52 is positioned between display chip 10 and driver chip 20. In addition, it is disclosed in the alternative to use conventional solder bump direct chip attach (DCA) bonding well known in the art, such as C5 DCA technology to attach display chip 10 and driver chip 20. Additional information and further disclosure on this type of light emitting diode array and driver package and method of fabrication, as well as disclosed alternative embodiments, is available in copending U.S. patent application entitled, "LED DISPLAY PACKAGING WITH SUBSTRATE REMOVAL AND METHOD OF FABRICATION", filed of equal date herewith, assigned to the same assignee, and incorporated herein by this reference.

In the assembly process, LED display chip 10 is inverted so that an uppermost surface 13 of LED array display chip 10, having connection pads 16, formed about the perimeter of display area 18, is placed in a downward position and connection pads 16 are positioned to each proximately align with a separate connection pad 28, formed on Si driver chip 20, when LED display chip 10 and Si driver chip 20 are properly registered, prior to interconnection. As previously stated, a layer of interchip bonding dielectric 52 is deposited between LED array display chip 10 and Si driver chip 20. Interchip bonding dielectric 52 serves to electrically isolate and mechanically bond display chip 10 and driver chip 20 as well as serve as an etch protect layer. It is disclosed that interchip bonding dielectric adhesive 52 may be an epoxy, polyimide, or other organic or inorganic dielectric adhesive material.

Figure 5:
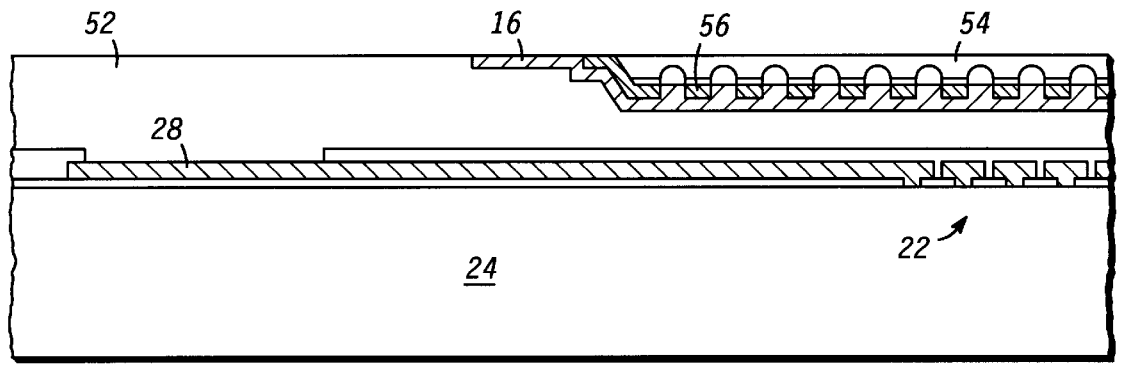
FIG. 5 is a simplified cross-sectional view illustrating a light emitting diode display chip flip mounted to the Si driver chip, in which the GaAs substrate of the light emitting diode display chip has been removed in accordance with the present invention.

Referring to FIG. 5, illustrated is a simplified, partial cross-sectional view, further showing LED array display chip 10 flip chip mounted to driver chip 20 of the present invention. Subsequent to the flip chip attachment of LED array display chip 10 to Si driver chip 20, substrate 12 (not shown) of LED array display chip 10 is selectively removed using conventional etching techniques. For instance, substrate 12, formed of undoped GaAs, is etched using wet etching techniques, or any alternative etching technique utilized in the art. In the alternative, as previously stated, an LED structure having formed therein a release layer, could be utilized in which the release layer is selectively etched away, thereby separating substrate 12 from the remaining LED epilayer structure. Once the GaAs substrate is removed, an indium-gallium-aluminum-phosphide (InGaAlP) epilayer 54 is left remaining, composed of the now exposed etch stop layer 41, as well as the exposed connection pads 16 located about the perimeter of display area 18. The light emitted by the LED array display chip 10, is now emitted from the back surface of LED array display chip 10 which is now the front surface of the LED display and driver package of the present invention. It is further disclosed during the formation of LED array 14 to form a plurality of LED contact metallizations 56, composed of a reflective metal, to reflect the emitted light into the viewing direction. This use of reflective metal will aid in eliminating lateral current crowding and will allow display chip 10 to provide approximately double the power output due to the optical reflection.

The removal of substrate 12 allows for the emission of light from what was initially the back of display chip 10. As previously stated, this formation of the package improves display performance by allowing higher luminance and large pixel fill factors due to the absence of light blocking metal line interconnects.

Figure 6:
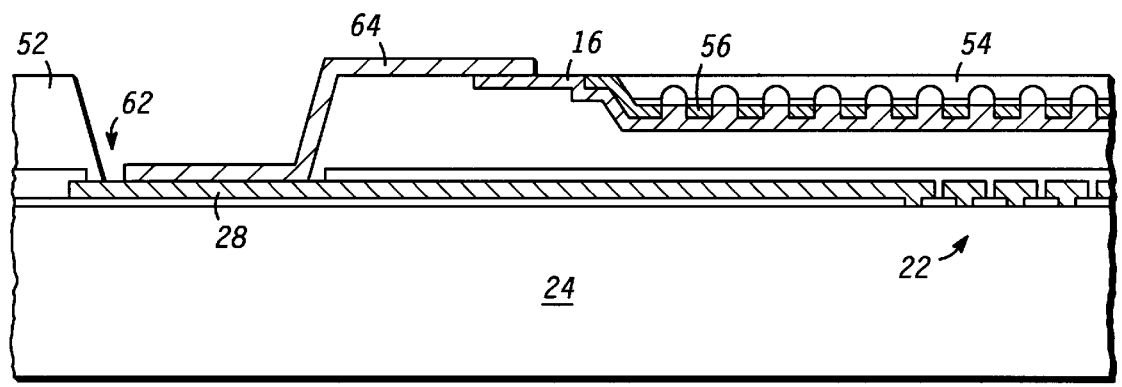
FIG. 6 is a simplified cross-sectional view illustrating final packaging of the light emitting display package in which the connection pads of the driver chip have been exposed, having metal interchip interconnects formed between the connection pads of the display chip and the driver chip.

Referring to FIG. 6, a simplified, partial cross-sectional view of a complete light emitting diode display and driver chip package 60 of the present invention is illustrated. Shown is the final step in the formation of LED display and driver chip package 60 of the present invention. Specifically, a plurality of vias 62 are etched into bonding dielectric layer 52 to expose drive chip connection pads 28. A plurality of pattern metal interconnect lines 64 are formed between connection pads 16 of display chip 10 and connection pads 28 of driver chip 20. This type of wafer level processing allows for photo patterned mass interconnection of a whole wafer of display assemblies with two photosteps and for the formation of small pads on both the display chip and the driver chip by using photolithography.

Thus, a new LED array display chip and driver package and method of fabricating an LED array together with its drive electronics which overcomes many of the prevalent problems is disclosed. The new and improved method of fabricating LED array and drive electronic packages is simpler and more efficient than other methods and is easily adaptable to high production levels. Further, the new and improved method of fabricating the package provides for packaging of the LED array display chip 10 and Si driver chip 20 using wafer level processing techniques.

The various steps of the method disclosed have been performed in a specific order for purposes of explanation, however, it should be understood that various steps of the disclosed method may be interchanged and/or combined with other steps in specific applications and it is fully intended that all such changes in the disclosed methods come within the scope of the claims.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. A method of fabricating a light emitting diode display package comprising the steps of:

providing a display chip, having a gallium arsenide (GaAs) substrate with a major surface;

forming an array of light emitting diodes on the major surface of the gallium arsenide (GaAs) substrate;

providing a driver chip formed on a silicon substrate;

flip chip mounting the display chip to the driver chip;

selectively removing the gallium arsenide (GaAs) substrate from the display chip thereby exposing an etch stop layer; and electrically interfacing the display chip to the driver chip utilizing a plurality of fan out interconnects positioned about a perimeter of the driver chip and the display chip.

2. A method of fabricating a light emitting diode display package as claimed in claim 1 wherein the step of electrically interfacing the display chip to the driver chip includes forming a plurality of bond pads, in electrical cooperation with the array of light emitting diodes and forming a plurality of bond pads, in electrical cooperation with the drive components, cooperatively positioned to engage the bond pads of the array of light emitting diodes.

3. A method of fabricating a light emitting diode display package as claimed in claim 2 wherein the step of forming a plurality of bond pads, in electrical cooperation with the array of light emitting diodes, includes positioning the bond pads about a perimeter of a display area, defined by the array of light emitting diodes of the display chip, and the step of forming a plurality of bond pads, in electrical cooperation with the drive components, includes routing the bond pads to an uppermost surface of the driver chip, cooperatively positioned to engage the bond pads of the array of light emitting diodes utilizing metal interchip interconnections.

4. A method of fabricating a light emitting diode display package comprising the steps of:

providing a light emitting diode chip having a gallium arsenide (GaAs) substrate with a major surface;

forming an array of light emitting diodes on the major surface of the gallium arsenide (GaAs) substrate, thereby defining a display area;

forming a plurality of bond pads about a perimeter of the display chip, in electrical cooperation with the array of light emitting diodes;

providing a driver chip formed on a silicon substrate, having a plurality of drive components formed therein;

forming a plurality of bond pads about a perimeter of the driver chip, in electrical cooperation with the drive components, cooperatively positioned to engage the bond pads of the array of light emitting diodes;

flip chip mounting the display chip to the driver chip;

selectively removing the gallium arsenide (GaAs) substrate from the light emitting diode chip, thereby exposing an etch stop layer; and interfacing the plurality of bond pads, in electrical cooperation with the array of light emitting diodes, to the plurality of bond pads, in electrical cooperation with the drive components of the driver chip, thereby electrically connecting the light emitting diode chip to the driver chip.

5. A method of fabricating a light emitting diode display package as claimed in claim 4 wherein the step of forming a plurality of bond pads, in electrical cooperation with the array of light emitting diodes, includes positioning the bond pads about a perimeter of the display area and the step of forming a plurality of bond pads, in electrical cooperation with the drive components, includes routing the bond pads to an uppermost surface of the driver chip, cooperatively positioned to engage the bond pads of the array of light emitting diodes utilizing metal interchip interconnections.

6. A method of fabricating a light emitting diode display package as claimed in claim 4 wherein the array of light emitting diodes formed on the major surface of the substrate is comprised of a plurality of indium-gallium-aluminum-phosphide (InGaAlP) light emitting diode structures.

7. A method of fabricating a light emitting diode display package as claimed in claim 6 wherein the step of forming an array of light emitting diodes further includes forming the etch stop layer on the major surface of the gallium arsenide (GaAs) substrate, forming a transparent conductive layer of material on the etch stop layer, forming a first carrier confinement layer on the conductive layer, forming an active layer on the first carrier confinement layer, forming a second carrier confinement layer on the active layer, selectively forming a conductive cap layer on the second carrier confinement layer to provide exposed surface areas of the second confinement layer, thereby defining exposed row areas and exposed column areas, with an array of diode light emitting areas covered by the conductive cap layer positioned in rows and columns therebetween.

8. A method of fabricating a light emitting diode display package as claimed in claim 5 wherein the step of forming an array of light emitting diodes further includes forming a plurality of LED contact metallizations, comprised of a reflective metal.

9. A method of fabricating a light emitting diode display package as claimed in claim 4 wherein the interfacing of the plurality of bond pads, in electrical cooperation with the array of light emitting diodes, to the plurality of bond pads in electrical cooperation with the driver device includes wafer level processing techniques.

10. A method of fabricating a light emitting diode display package as claimed in claim 9 wherein the interfacing of the plurality of bond pads further includes depositing a layer of interchip bonding dielectric between the light emitting diode chip and the driver chip.

11. A method of fabricating a light emitting diode display package as claimed in claim 4 wherein the step of removing the gallium arsenide (GaAs) substrate from the light emitting diode chip includes selectively etching away the substrate, thereby leaving an indium-gallium-aluminum-phosphide epilayer of the light emitting diode chip exposed.

12. A method of fabricating a light emitting diode display package as claimed in claim 4 wherein the step of removing the gallium arsenide (GaAs) substrate from the light emitting diode chip includes a release layer, whereby the release layer is selectively etched away, leaving an indium-gallium-aluminum-phosphide epilayer of the light emitting diode chip exposed.

13. A method of fabricating a light emitting diode display package comprising the steps of:

providing a display chip having a gallium arsenide (GaAs) substrate with a major surface;

forming an array of indium gallium aluminum phosphide (InGaAlP) light emitting diodes on the major surface of the gallium arsenide (GaAs) substrate, thereby defining a display area;

forming a plurality of bond pads, in electrical cooperation with the array of light emitting diodes, positioned about a perimeter of the display area;

forming a plurality of row and column connections, routed to the plurality of bond pads in electrical cooperation with the array of light emitting diodes;

providing a driver chip formed on a silicon substrate, having a plurality of drive components formed therein;

forming a plurality of bond pads, in electrical cooperation with the drive components, routed to an uppermost surface of the driver device, cooperatively positioned to engage the bond pads of the array of light emitting diodes;

flip chip mounting the display chip to the driver chip in flip chip orientation;

depositing a layer of non-conductive material within an area defined between the display chip and the driver chip;

selectively removing the gallium arsenide (GaAs) substrate from the display chip thereby exposing an indium-gallium-aluminum-phosphide epilayer of the display chip; and interconnecting the plurality of bond pads, in electrical cooperation with the array of light emitting diodes of the display chip, to the plurality of bond pads, in electrical cooperation with the drive components of the driver chip, using wafer level processing, thereby electrically connecting the display chip to the driver chip.

14. A method of fabricating a light emitting diode display package as claimed in claim 13 wherein the array of light emitting diodes formed on the major surface of the gallium arsenide (GaAs) substrate is comprised of a plurality of indium-gallium-aluminum-phosphide (InGaAlP) light emitting diode structures.

15. A method of fabricating a light emitting diode display package as claimed in claim 14 wherein the step of forming an array of light emitting diodes further includes forming the indium-gallium-aluminum-phosphide epilayer on the major surface of the gallium arsenide (GaAs) substrate, forming a first carrier confinement layer on the conductive layer, forming an active layer on the first carrier confinement layer, forming a second carrier confinement layer on the active layer, selectively forming a conductive cap layer on the second carrier confinement layer to provide exposed surface areas of the second confinement layer, thereby defining exposed row areas and exposed column areas, with an array of diode light emitting areas covered by the conductive cap layer positioned in rows and columns therebetween.

16. A method of fabricating a light emitting diode display package as claimed in claim 13 wherein the step of forming an array of light emitting diodes further includes forming a plurality of LED contact metallizations, comprised of a reflective metal.

17. A method of fabricating a light emitting diode display package as claimed in claim 13 wherein the step of depositing a layer of non-conductive material within an area defined between the display chip and the driver chip includes depositing a layer of interchip bonding dielectric adhesive.

18. A method of fabricating a light emitting diode display package as claimed in claim 13 wherein the step of removing the gallium arsenide (GaAs) substrate from the display chip includes selectively etching away the gallium arsenide (GaAs) substrate, thereby leaving the indium-gallium-aluminum-phosphide epilayer of the display chip exposed.

19. A method of fabricating a light emitting diode display package as claimed in claim 13 wherein the step of removing the gallium arsenide (GaAs) substrate from the display chip includes a release layer, whereby the release layer is selectively etched away, leaving the indium-gallium-aluminum-phosphide epilayer of the light emitting diode chip exposed.

20. A method of fabricating a light emitting diode display package as claimed in claim 13 wherein the step of interconnecting the plurality of bond pads in electrical cooperation includes etching a plurality of vias into the non-conductive material to expose the bond pads in electrical cooperation with the drive components of the driver chip.

21. A method of fabricating a light emitting diode display package comprising the steps of:

providing a substrate of gallium arsenide (GaAs) with a major surface;

forming an array of indium gallium aluminum phosphide (InGaAlP) light emitting diodes on the major surface of the substrate, thereby forming a light emitting diode device having a defined display area;

forming a plurality of bond pads in electrical cooperation with the array of light emitting diodes, positioned about a perimeter of the display area;

forming a plurality of electrically isolated row and column connections, routed to the plurality of bond pads in electrical cooperation with the array of light emitting diodes;

providing a separate driver device formed on a silicon substrate, having a plurality of drive components formed therein;

forming a plurality of bond pads in electrical cooperation with the drive components, routed to an uppermost surface of the driver device;

depositing a layer of interchip bonding dielectric adhesive within an area defined between the display chip and the driver chip;

selectively removing the gallium arsenide (GaAs) substrate from the light emitting diode device, thereby leaving an exposed epilayer; and interconnecting the plurality of bond pads in electrical cooperation with the light emitting diodes, in flip chip attachment to the plurality of bond pads in electrical cooperation with the drive components of the driver device, thereby electrically connecting the light emitting diode device to the driver device utilizing wafer level processing.

22. A method of fabricating a light emitting diode display package as claimed in claim 21 wherein the array of light emitting diodes is comprised of a plurality of indium-gallium-aluminum-phosphide (InGaAlP) light emitting diode structures.

23. A method of fabricating a light emitting diode display package as claimed in claim 21 wherein the step of forming an array of light emitting diodes on the major surface of the substrate, includes forming a plurality of layers of material on the substrate, including at least an etch stop layer of material, supported by the major surface of the substrate, a conductive layer of material on the etch stop layer, a first carrier confinement layer on the conductive layer, an active layer on the first carrier confinement layer, and a second carrier confinement layer on the active layer and implanting impurities in the plurality of layers of material into a plurality of isolated light emitting diodes positioned in an array of rows and columns and to form a plurality of vertical conductors through at least some of the plurality of layers to provide surface contacts to each diode in the array.

* * * * *